(12) United States Patent
Shimizu

(10) Patent No.: US 6,900,125 B2
(45) Date of Patent: May 31, 2005

(54) METHOD OF MANUFACTURING A SEMICONDUCTOR DEVICE INCLUDING A MULTI-LAYER INTERCONNECT STRUCTURE

(75) Inventor: Ryu Shimizu, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 62 days.

(21) Appl. No.: 10/669,058

(22) Filed: Sep. 24, 2003

(65) Prior Publication Data

US 2004/0259349 A1 Dec. 23, 2004

(30) Foreign Application Priority Data

Sep. 30, 2002 (JP) ............................. 2002-287671

(51) Int. Cl.$^7$ ............................................ H01L 21/4763
(52) U.S. Cl. .......................... 438/638; 438/694; 438/761
(58) Field of Search ....................... 438/638, 694, 438/701, 714, 734, 737, 761, 924

(56) References Cited

U.S. PATENT DOCUMENTS

| | | | | |
|---|---|---|---|---|
| 6,197,681 B1 | * | 3/2001 | Liu et al. | 438/637 |
| 6,424,039 B2 | * | 7/2002 | Wang et al. | 257/750 |
| 6,589,881 B2 | * | 7/2003 | Huang et al. | 438/725 |

FOREIGN PATENT DOCUMENTS

JP     2000-091425 A     3/2000

\* cited by examiner

*Primary Examiner*—Phuc T. Dang
(74) *Attorney, Agent, or Firm*—McDermott Will & Emery LLP

(57) ABSTRACT

When forming the interconnect trench by "via first" method of the dual damascene process, after providing a via hole in the interlayer dielectric film 11, the anti-reflection coating 5 and the resist layer 6 are formed such that whichever has a faster etching rate in the formation process of the interconnect trench, out of the anti-reflection coating 5 and the resist layer 6, is disposed at the same level as a bottom portion of the interconnect trench to be formed through the formation process thereof.

9 Claims, 11 Drawing Sheets

FIG.9B $y$

METHOD OF MANUFACTURING A SEMICONDUCTOR DEVICE INCLUDING A MULTI-LAYER INTERCONNECT STRUCTURE

This application is based on Japanese patent application NO.2002-287671, the content of which is incorporated hereinto by reference.

BACKGROUND OF THE INVENTION

1. Field of the Invention

The present invention relates to a method of manufacturing a semiconductor device including a multi-layer interconnect structure.

2. Description of the Related Art

Recently, copper has come to be more popularly used as a material of an interconnect of a semiconductor device, because of its low specific resistance. Since it is difficult to perform reactive ion etching on copper, the damascene process is usually employed for forming the interconnect when using copper as the interconnect material. The damascene process includes a single damascene process in which an interconnect layer and a via plug are sequentially formed, and a dual damascene process in which both the interconnect layer and via plug are formed at a time. Among these processes, the dual damascene process, disclosed in JP-A No.2000-91425 for example, is more advantageous from a viewpoint of simplifying manufacturing steps.

The dual damascene process for forming an interconnect structure includes so-called "via first" approach and "trench first" approach. The "via first" approach represents a process of forming a via hole portion first, and then forming a trench for the interconnect over the via hole portion in accordance with the via hole pattern. On the other hand, the "trench first" approach means a process of forming the trench for the interconnect first and then forming the via hole according to the trench pattern. Of these approaches, the former is more advantageous from a viewpoint of assuring correct performance of the via hole as a contact. Now referring to FIGS. 1A to 4B, conventional "via first" steps of the dual damascene process will be described below.

First, a lower interconnect layer 1 is formed in a predetermined pattern on a silicon substrate, which is not shown in the drawings (FIG. 1A). A copper-diffusion barrier 2 consisting of silicon nitride (SiN) is formed over the substrate, and an interlayer dielectric film 3 consisting of silicon oxide (SiO$_2$) is formed over the copper diffusion barrier 2 (FIG. 1B). Then a via hole 4 is formed on the interlayer dielectric film 3 by lithography and etching (FIG. 1C).

Then spin coating of an organic substance is performed to form an anti-reflection coating 5 all over the substrate including the via hole. At this stage, the anti-reflection coating 5 is formed in a greater thickness inside the via hole than over a surrounding flat region, because the material pools inside the via hole during the spin coating process (FIG. 2A).

A resist layer 6 is formed over the anti-reflection coating 5 (FIG. 2B), after which an opening is formed around the via hole 4 by exposure through a photo mask defining an upper interconnect pattern followed by alkaline development, so that a resist pattern is formed (FIG. 2C). Then a portion of the anti-reflection coating 5 and of the interlayer dielectric film 3 exposed inside the opening formed as above are sequentially removed by etching, through the resist layer 6 with the opening utilized as a mask. As a result, an interconnect trench is formed at an upper portion of the via hole (FIGS. 3A, 3B). After that, copper is buried in the via hole and the interconnect trench, and finally the lower interconnect, the upper interconnect and the via connecting the interconnects are formed through CMP (chemical mechanical polishing) process for removing copper existing in a region outside the opening.

However, in the conventional process, a cylindrical projection is prone to be formed in the interconnect trench, as shown in FIGS. 3A and 3B. The reason of appearance of such projection will be explained in the following.

When starting the etching of the interconnect trench, the anti-reflection coating and the resist layer are filled inside the via hole. These layers are made of different materials, therefore the etching rate is also different with the respective layers during the etching process of the interconnect trench. Accordingly either layer having a slower etching rate remains unremoved with the progress of the etching process, finally forming a relatively projecting portion. In general, the anti-reflection coating is less sensitive to etching than the resist layer in the etching process of the interlayer dielectric film, in which case the anti-reflection coating 5 remains in a cylindrical shape around a sidewall of the via as shown in FIG. 3A.

Now, since the sidewall of the via is slightly tapered, a portion of the interlayer dielectric film 3 hidden under the cylindrical projection tends to be left unremoved by etching. Consequently, the interlayer dielectric film 3 remaining at this point forms a projection (FIG. 3B). Such projection is bent (FIG. 4A) as a result of a subsequent ashing process for removing the resist layer 6, and the bent portion disturbs an adequate step coverage during the burying process of the interconnect material, thereby causing a faulty deposition of a barrier metal 25 (FIG. 4B). Also, in case of forming a copper layer by plating, a copper seed layer is also prone to cause a similar faulty deposition.

SUMMARY OF THE INVENTION

In view of the foregoing problems, it is an object of the present invention to provide a technique for preventing the formation of a projection originating from residue of an anti-reflection coating or the like, thereby constantly forming a buried metal layer in accordance with a predetermined design.

According to the present invention, there is provided a method of manufacturing a semiconductor device, comprising: forming a lower interconnect on a semiconductor substrate; forming an dielectric film on the lower interconnect; performing selective etching on the dielectric film to form a via hole that reaches the proximity of the lower interconnect; forming an anti-reflection coating at a bottom portion of the via hole; forming a resist layer over the substrate so as to substantially fill a space remaining on the anti-reflection coating in the via hole; forming an opening in the resist layer; performing selective etching on the dielectric film utilizing the resist layer as a mask to form an interconnect trench for connection with the via hole; removing the resist layer and the anti-reflection coating in the via hole to have an upper surface of the lower interconnect exposed; and substantially filling the via hole and the interconnect trench with a metal layer; wherein the anti-reflection coating is formed to have its thickness at a central portion of the via hole thinner than a distance between the upper surface of the lower interconnect and a bottom portion of the interconnect trench in the forming the anti-reflection coating.

Generally an anti-reflection coating consists of a material less sensitive to etching than a material of a resist layer, in an etching process of an interlayer dielectric film. Also, a degenerated or brittle layer may be formed at an interface between the anti-reflection coating and the resist layer. Therefore, a projection is likely to appear through an etching process for forming an interconnect trench with the anti-reflection coating exposed. According to the above method, however, since a thickness of the anti-reflection coating is made thinner than a distance between the upper surface of the lower interconnect and a bottom portion of the interconnect trench, exposure of the anti-reflection coating can be restrained, resulting in effective prevention of the formation of a projection. Here, the "via hole" includes any contact holes formed in dielectric layers of the semiconductor device. It means that the "via hole" includes a hole formed in a dielectric layer formed between a substrate and an interconnect layer, in addition to a hole formed in a dielectric layer formed between interconnect layers.

This manufacturing method is effective when an etching rate of the anti-reflection coating is slower than that of the resist layer in case of etching for forming an interconnect trench, as well as in the contrary case, i.e. when the etching rate of the anti-reflection coating is faster than that of the resist layer. According to the method of the invention, since the etching of the interconnect trench is performed with the via hole sufficiently filled with the anti-reflection coating, for example an excessive etching of the anti-reflection coating is prevented, and resultantly the lower interconnect can be kept from being exposed and suffering a damage at a surface thereof. Further, even though a degenerated or brittle layer has emerged at an interface between the anti-reflection coating and the resist layer, since the interface itself is located at a lower level than the interconnect trench according to the above manufacturing method, formation of a projection because of the degenerated or brittle layer can be prevented.

The foregoing manufacturing method may further comprise removing the anti-reflection coating remaining at a sidewall of the via hole, between the forming an opening in the resist layer and the forming the interconnect trench.

As a result, the prevention of the formation of a projection associated with the application of the anti-reflection coating can be further assured, regardless of type of material and application condition of the anti-reflection layer. Specific techniques of removing the anti-reflection coating remaining on the sidewall of the via hole include, (i) applying a lower bias to the substrate instead of performing an ordinary mode of anisotropic etching, or performing isotropic etching without applying a bias, or (ii) increase an oxygen content in the etching process, and also the (i) and (ii) may be employed in combination as the case may be.

According to the present invention, there is provided a method of manufacturing a semiconductor device, comprising: forming a lower interconnect on a semiconductor substrate; forming an dielectric film on the lower interconnect; performing selective etching on the dielectric film to form a via hole that reaches the proximity of the lower interconnect; forming an anti-reflection coating at a bottom portion of the via hole; forming a resist layer over the substrate so as to substantially fill a space remaining on the anti-reflection coating in the via hole; forming an opening in the resist layer; performing selective etching on the dielectric film utilizing the resist layer as a mask to form an interconnect trench for connection with the via hole; removing the resist layer and the anti-reflection coating in the via hole to have an upper surface of the lower interconnect exposed; and substantially filling the via hole and the interconnect trench with a metal layer; wherein the interconnect trench is formed with the anti-reflection coating formed in the via hole being covered with the resist layer in the forming the interconnect trench.

According to the present invention, there is provided A method of manufacturing a semiconductor device, comprising: forming a lower interconnect on a semiconductor substrate; forming an dielectric film on the lower interconnect; performing selective etching on the dielectric film to form a via hole that reaches the proximity of the lower interconnect; forming an anti-reflection coating at a bottom portion of the via hole; forming a resist layer over the substrate so as to substantially fill a space remaining in the via hole; forming an opening in the resist layer; performing selective etching on the dielectric film utilizing the resist layer as a mask to form an interconnect trench for connection with the via hole; removing the resist layer and the anti-reflection coating in the via hole; and substantially filling the via hole and the interconnect trench with a metal layer; wherein a material and a forming condition of the anti-reflection coating and the resist layer are selected in such a manner that an etching rate of the anti-reflection coating becomes faster than an etching rate of the resist layer in the performing etching on the dielectric film to form the interconnect trench, and the anti-reflection coating is formed to have its thickness at a central portion of the via hole greater than a distance between the upper surface of the lower interconnect and a bottom portion of the interconnect trench in the forming the anti-reflection coating.

According to this method of manufacturing the semiconductor device, the anti-reflection coating is formed in such a manner that the etching rate of the anti-reflection coating becomes faster than that of the resist layer, during the etching process of the interconnect trench. Such anti-reflection coating can be formed through appropriate selection of a coating material, coating conditions and so forth. In this manufacturing method, the thickness of the anti-reflection coating is made greater than a distance between the upper surface of the lower interconnect and a bottom portion of the interconnect trench, on the premise of forming the anti-reflection coating in the aforementioned manner. As a result, both of the anti-reflection coating and the resist layer remain unremoved during the formation of the interconnect trench, however in a latter period of the interconnect trench formation majority of the residue is the anti-reflection coating that was formed at a lower level. Since the anti-reflection coating is designed to be relatively sensitive to etching, the formation of a projection is restrained.

It is also preferable to remove the resist layer inside the via hole to an extent that the anti-reflection coating is not exposed, during the formation of the opening in the resist layer. Reducing a thickness of the resist layer at this stage leads to a reduced remaining thickness of the anti-reflection coating or the resist layer, and therefore further restrains the formation of a projection.

In this way, according to the manufacturing method of the invention, when forming the anti-reflection coating and the resist layer inside the via hole, whichever has a faster etching rate out of the anti-reflection coating and the resist layer is disposed at the same level as a bottom portion of the interconnect trench to be formed through the formation process thereof. Therefore, the formation of a projection is restrained.

For the manufacturing method of the invention, a material containing a novolac polymer or an acrylate polymer can be cited as an example of a material for forming the anti-reflection coating. Also, a photosensitive material sensitive to light having a wavelength of 100 nm to 400 nm, electron beam, X-ray or ion beam can be employed to constitute the resist layer. These films can be formed by a spin coating method to apply such materials.

The manufacturing method of the invention is applicable to various types of interconnect structures, among which the method is especially appropriate to a multi-layer interconnect structure having two or more interconnect levels.

BRIEF DESCRIPTION OF THE DRAWINGS

FIGS. 9A to 9C are schematic cross-sectional views progressively showing a method of manufacturing a semiconductor device according to the invention;

DETAILED DESCRIPTION OF THE INVENTION

Now referring to the accompanying drawings, preferred embodiments of the present invention will be described. In the following embodiments, copper is used as an interconnect material, and an SiOC single-layer formed through CVD process is used as an interlayer dielectric film. Here, the SiOC layer normally consists essentially of elements of Si, O, C and H, and may therefore be referred to as "SiOCH layer". Also, in an etching process on the interlayer dielectric film to form an interconnect trench, an etching rate of an anti-reflection coating is $1/5$ and an etching rate of a resist layer is $1/2$ with respect to an etching rate of the interlayer dielectric film in the following first and second embodiments. In addition, in the third embodiment the etching rate of the anti-reflection coating is $1/2$ and the etching rate of the resist layer is $1/4$ with respect to an etching rate of the interlayer dielectric film.

First Embodiment

The first embodiment will be described referring to FIGS. 5A to 5C and 6A to 6C.

Figure 5A:
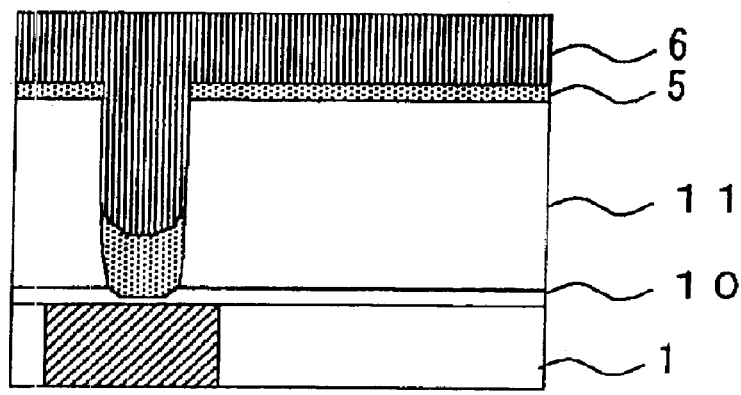
FIGS. 5A to 5C are schematic cross-sectional views progressively showing a method of manufacturing a semiconductor device according to the present invention.

First, steps up to FIG. 5A will be explained. A lower interconnect layer 1 including a copper interconnect in a predetermined pattern is formed on a semiconductor substrate, which is not shown in the drawings, and a copper diffusion barrier 10 consisting essentially of SiC is formed thereon. Then an interlayer dielectric film (thickness 800 nm) essentially consisting of SiOC is formed through CVD process, on the copper diffusion barrier 10. After that, a via hole as deep as reaching the copper diffusion barrier 10 in the interlayer dielectric film 11, is formed by lithography and etching. Then spin coating is performed to form an anti-reflection coating 5 all over the substrate. The anti-reflection coating 5 serves to prevent shape degradation that may be caused by diffuse reflection when performing photolithography to define a trench pattern in the subsequent step. In this embodiment, DUV-30J manufactured by Nissan Chemical Industries, Ltd. is employed as the material for the anti-reflection coating, and is formed in a thickness of 70 nm on a plain surface where the via hole is not located. At this stage, a depth "y" in the drawing is 300 nm at a central portion of the via hole. Once the anti-reflection coating 5 is thus deposited in a part of the via hole, a resist layer 6 essentially consisting of a resist material for KrF is formed all over the substrate, so that the remaining space in the via hole is filled.

Figure 5B:
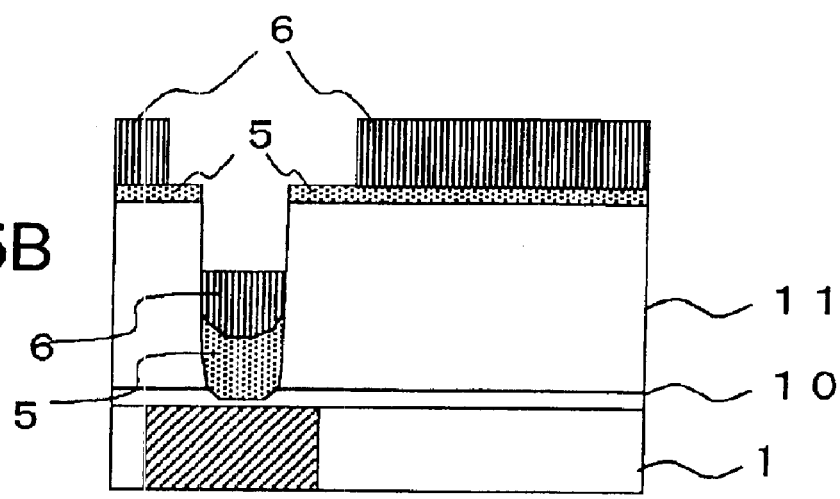

After these steps, an opening is provided in the resist layer 6, for forming an interconnect trench by etching (FIG. 5B). Then etching is performed utilizing the resist layer 6 as a mask, to sequentially remove the anti-reflection coating 5 and the interlayer dielectric film 11 and to thereby form the interconnect trench on an upper portion of the via hole (FIG. 5C).

Figure 1A:
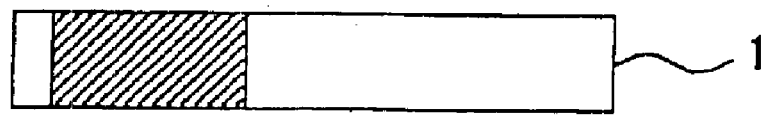
FIGS. 1A to 1C are schematic cross-sectional views progressively showing a conventional method of manufacturing a semiconductor device.
Figure 1B:
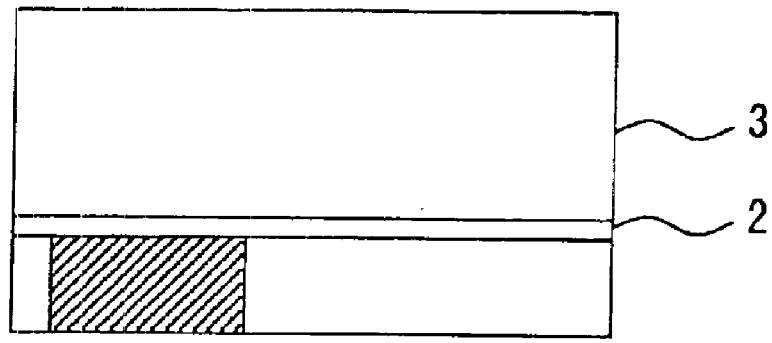
Figure 1C:
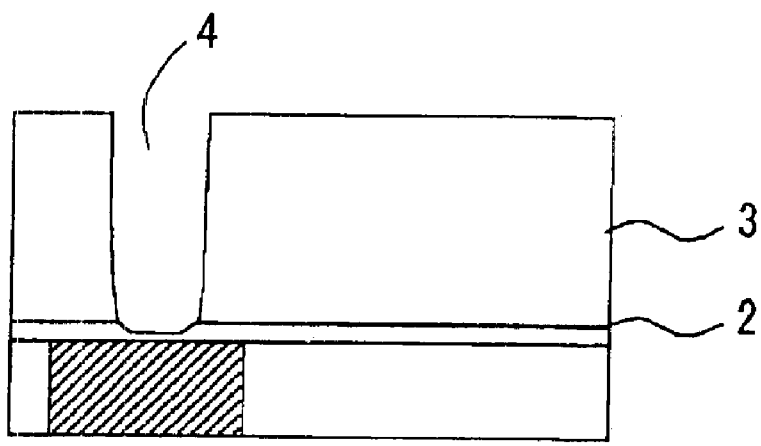
Figure 2A:
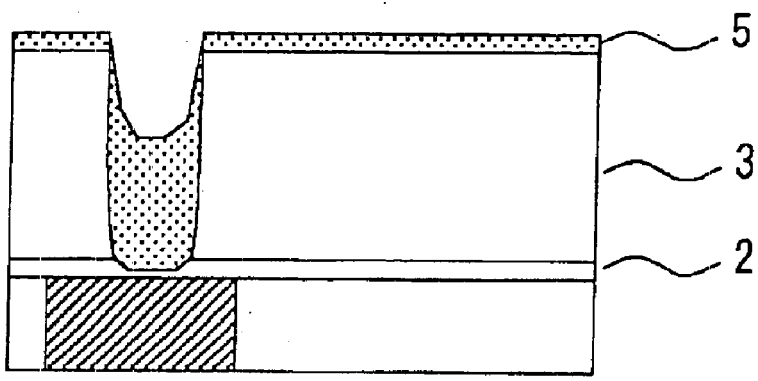
FIGS. 2A to 2C are schematic cross-sectional views progressively showing a conventional method of manufacturing a semiconductor device.
Figure 2B:
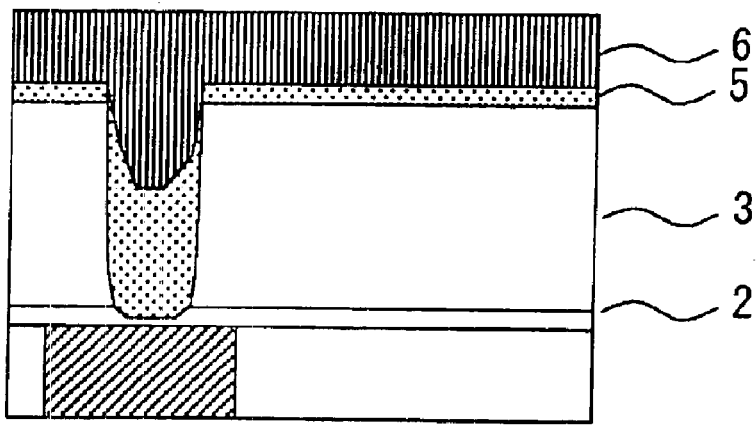
Figure 2C:
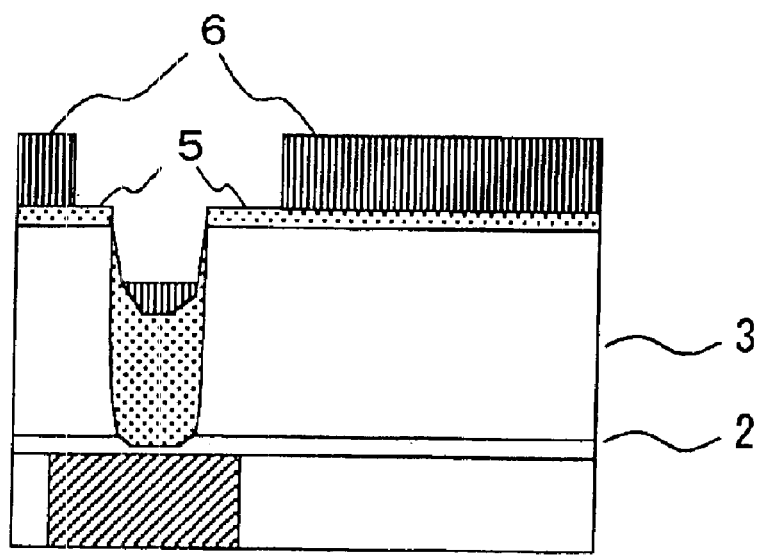
Figure 3A:
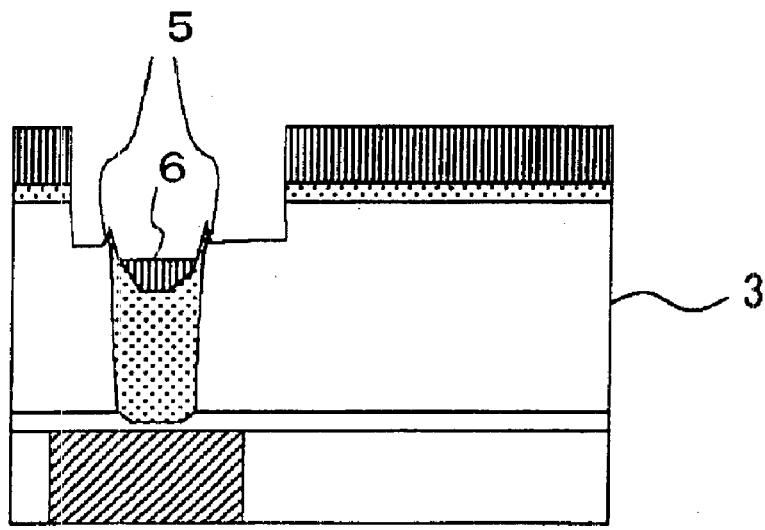
FIGS. 3A and 3B are schematic cross-sectional views progressively showing a conventional method of manufacturing a semiconductor device.
Figure 3B:
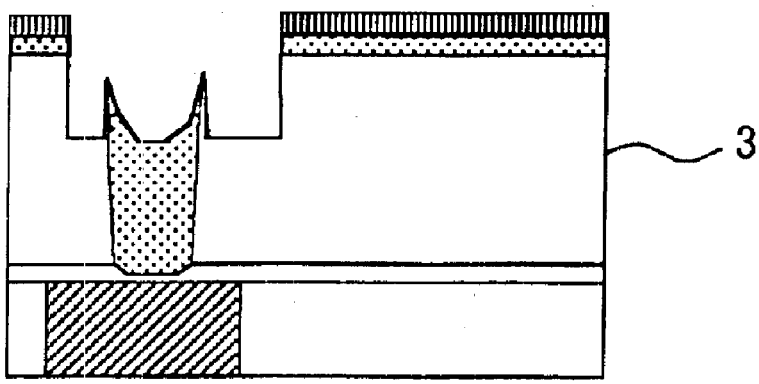
Figure 4A:
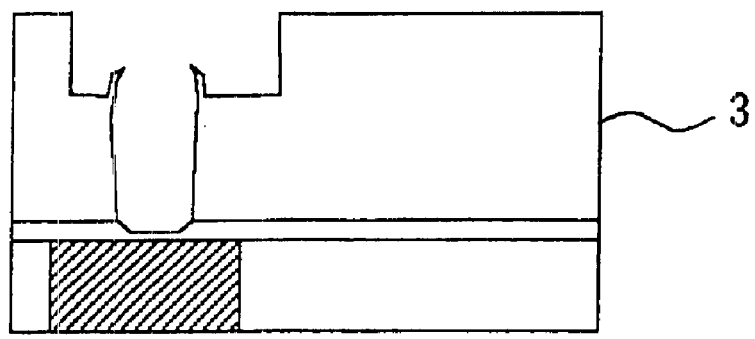
FIGS. 4A and 4B are schematic cross-sectional views progressively showing a conventional method of manufacturing a semiconductor device.
Figure 4B:
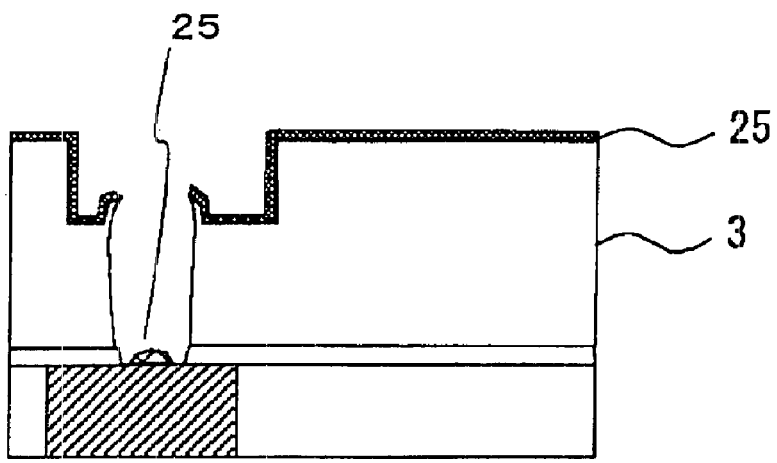
Figure 5C:
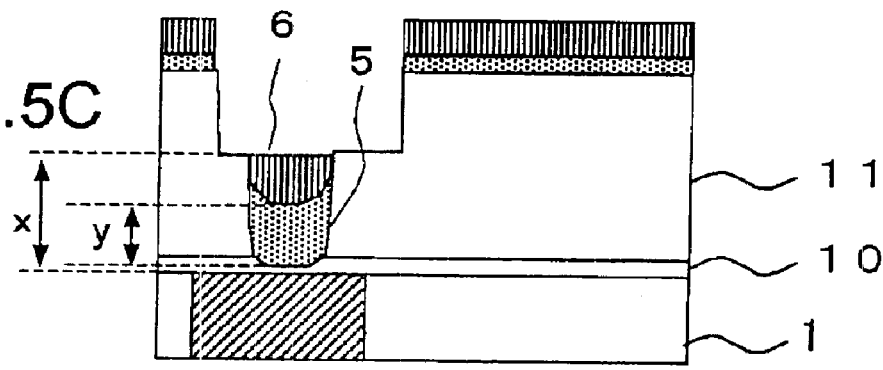

Referring to FIG. 5C, the anti-reflection coating 5 is controlled to have a thickness that satisfies x>y, where x stands for a distance between a bottom portion of the interconnect trench and an upper surface of the lower interconnect layer 1 (upper surface of the lower interconnect), and y for a thickness of the anti-reflection coating 5 at a central portion of the via hole. Accordingly, the anti-reflection coating 5 is not exposed but the resist layer 6 alone is exposed at the point in the interconnect trench where the via hole is located. Also, the anti-reflection coating that may remain on a sidewall of the via hole is negligibly thin. For these reasons the anti-reflection coating 5, which is not sensitive to etching, is not exposed in the interconnect trench and in the via hole, and resultantly the formation of a projection as shown in FIG. 3 is restrained.

Figure 6A:
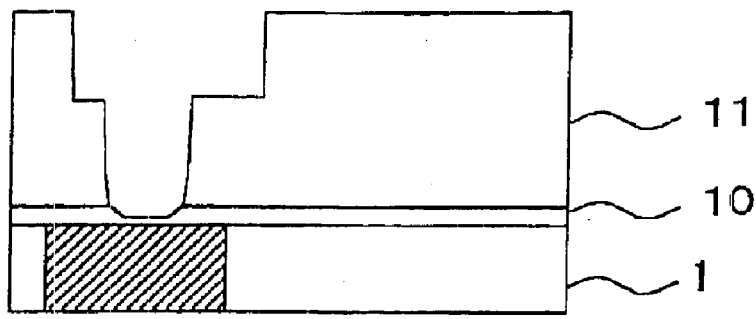
FIGS. 6A to 6C are schematic cross-sectional views progressively showing a method of manufacturing a semiconductor device according to the invention.
Figure 6B:
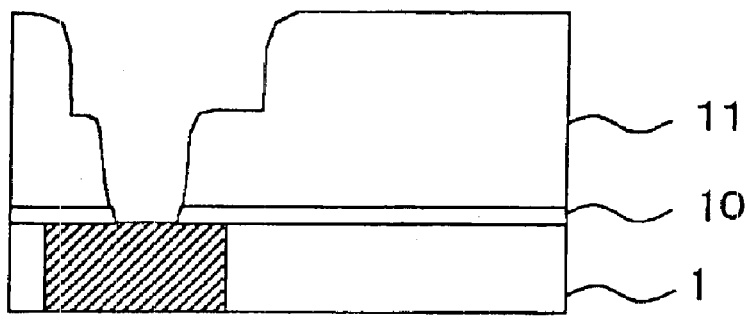
Figure 6C:
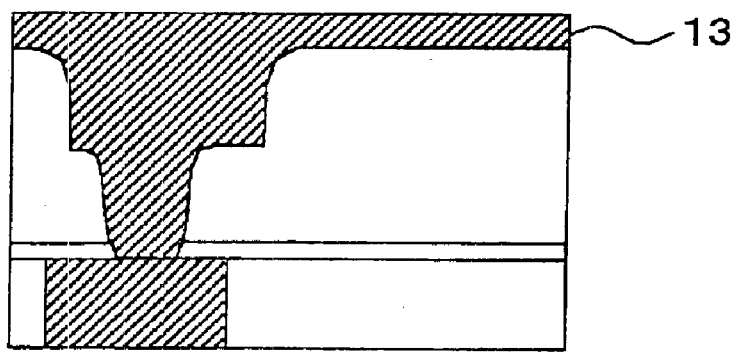

Now the anti-reflection coating 5 and the resist layer 6 on the plain surface of the substrate and inside the via hole are removed (FIG. 6A), after which an opening is provided in the copper diffusion barrier 10 (FIG. 6B). Then a copper layer 13 is filled in the via hole and the interconnect trench, and the copper applied outside the recess is removed by etching utilizing CMP method, so that the upper interconnect and the via for connecting the upper interconnect and the lower interconnect are formed at a time (FIG. 6C).

According to the manufacturing method described in this embodiment, the application of the anti-reflection coating improves yield factor during the photolithography process, while at the same time the formation of a projection associated with the application of the anti-reflection coating can be restrained. As a result, a highly reliable interconnect structure can be obtained.

Second Embodiment

In the process described with respect to the first embodiment, the anti-reflection coating may remain on the sidewall of the via hole, depending on a material of the anti-reflection coating or applying condition. In such case, a cylindrical projection may be formed at a point hidden under the residue of the anti-reflection coating on the sidewall, despite that the relation of x>y is maintained. The second embodiment refers to a process in which such residue of the anti-reflection coating is removed, so that the formation of a cylindrical projection is restrained.

Figure 7A:
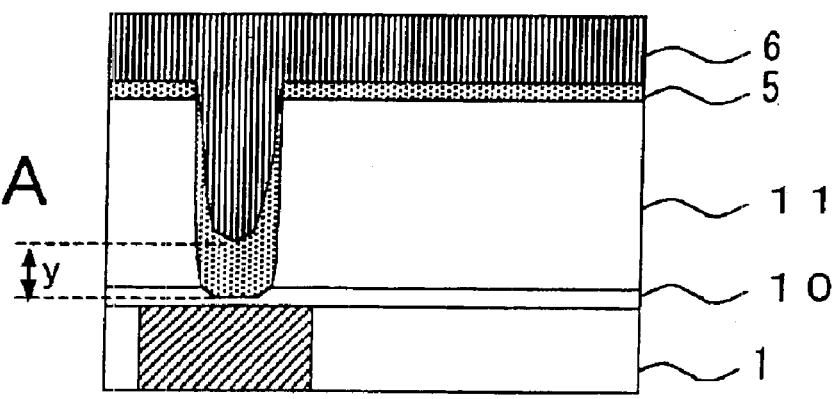
FIGS. 7A to 7C are schematic cross-sectional views progressively showing a method of manufacturing a semiconductor device according to the invention.
Figure 7B:
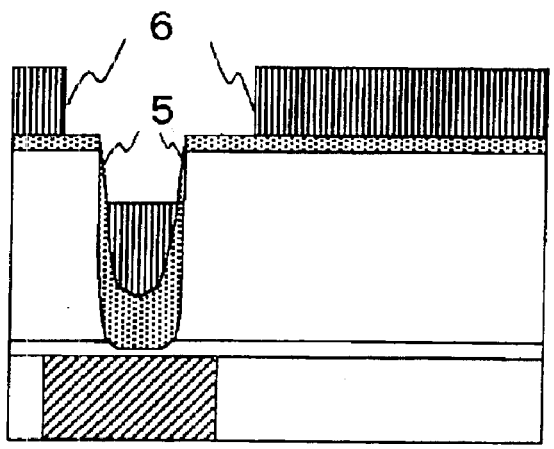
Figure 7C:
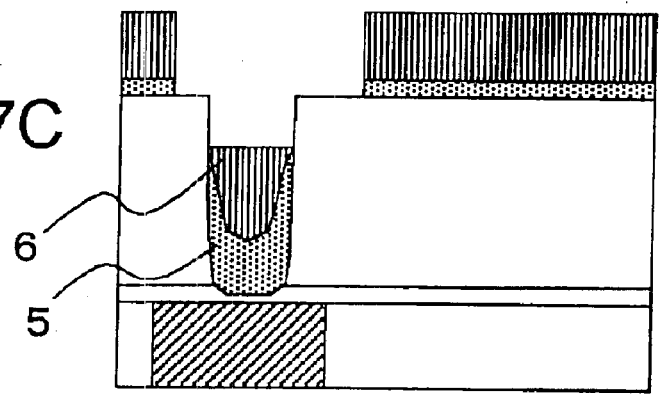

FIGS. 7A to 7C show a method of manufacturing a semiconductor device according to this embodiment. Similarly to the first embodiment, the lower interconnect 1 and the interlayer dielectric film 11 are first formed, and after forming the via hole in the interlayer dielectric film 11 the anti-reflection coating 5 and the resist layer 6 are formed in the via hole (FIG. 7A). In this embodiment, it is shown that a different solution from that of the first embodiment is applied to form the anti-reflection coating. In this case, the anti-reflection coating 5 forms an upwardly extending portion along the sidewall of the via hole as shown in FIG. 7A.

Then an opening is provided in the resist layer 6, for forming an interconnect trench by etching (FIG. 7B). At this step, a part of the resist layer 6 remaining in the via hole is removed, while the extending portion of the anti-reflection coating 5 remains on the sidewall inside the via hole. Accordingly, in case where an ordinary anisotropic etching is performed to remove the anti-reflection coating 5 the extending portion of the anti-reflection coating 5 is left unremoved. Therefore a portion of the interlayer dielectric film 11 covered with the extending portion of the anti-reflection coating 5 remains unremoved through the subsequent etching process for defining the interconnect trench, thus forming a cylindrical projection. In view of such problem, this embodiment includes a step of removing the extending portion of the anti-reflection coating 5 when performing the etching on the anti-reflection coating 5 on the plain surface region of the substrate utilizing the resist layer 6 as a mask under the state of FIG. 7B. For assuring the removal, it is effective to apply a lower bias to the substrate instead of performing an ordinary mode of anisotropic etching, or performing isotropic etching without applying a bias. In addition, it is also preferable to increase an oxygen content in the etching gas, or to employ these methods in an appropriate combination.

Figure 8A:
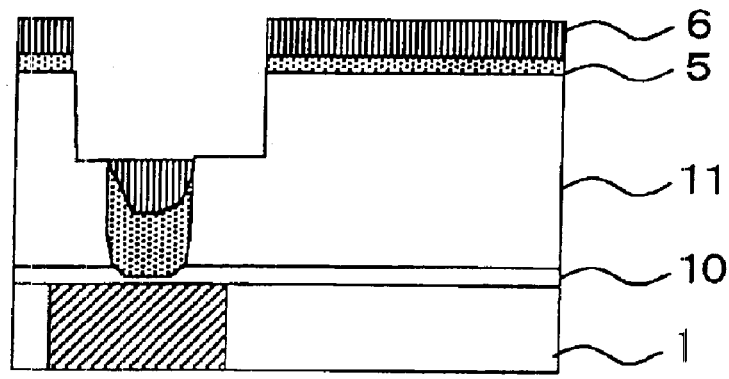
FIGS. 8A to 8C are schematic cross-sectional views progressively showing a method of manufacturing a semiconductor device according to the invention.
Figure 8B:
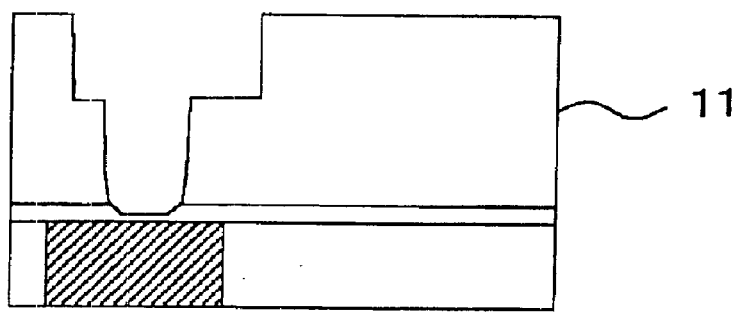
Figure 8C:
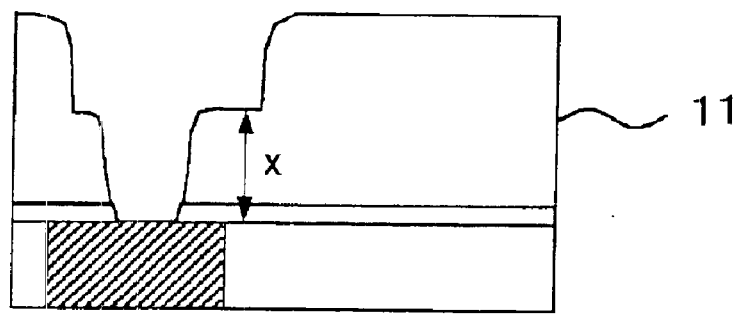

FIG. 7C shows a state achieved upon completing the foregoing process. Under this state, etching is performed on the interlayer dielectric film 11 with the resist layer 6 utilized as a mask, so that the interconnect trench is formed (FIG. 8A). Then the anti-reflection coating 5 and the resist layer 6 are removed (FIG. 8B), after which the copper diffusion barrier 10 is removed so that an upper surface of the lower interconnect is exposed (FIG. 8C). Finally, similar to the first embodiment, the copper layer is buried in the interconnect trench and the via hole and then CMP process is performed for completion of the interconnect structure.

According to this embodiment, since a film thickness of the anti-reflection coating 5 is made thinner, the anti-reflection coating 5 that remains on the sidewall is thinner than that of a conventional case shown in FIGS. 2A through 3B. Therefore, the residue of the film on the sidewall can be removed to a sufficient extent simply by adjusting the etching conditions for the anti-reflection coating. According to the method of this embodiment, prevention of the formation of a projection associated with the application of the anti-reflection coating can be further ensured, and a highly reliable semiconductor device can be obtained.

Third Embodiment

The first and the second embodiments refer to a case where the etching rate of the anti-reflection coating is slower than the etching rate of the resist layer, in the etching process to form the interconnect trench. This is a situation that generally takes place with a material popularly employed for the anti-reflection coating. However it is also possible that the etching rate of the anti-reflection coating becomes faster than that of the resist layer, depending on selection of a material for the anti-reflection coating or an applying condition. Even in such case the process of preventing exposition of the anti-reflection coating during the formation of the interconnect trench according to the first and the second embodiments is effective, however another effective process will be described in the following as the third embodiment.

Figure 9A:
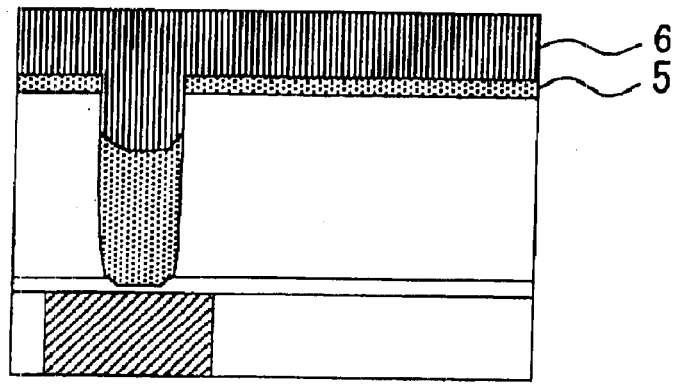

First, similar to the first embodiment, the lower interconnect 1 and the interlayer dielectric film 11 are formed, and after forming the via hole in the interlayer dielectric film 11, the anti-reflection coating 5 and the resist layer 6 are formed in the via hole (FIG. 9A). Here, the anti-reflection coating 5 is formed thicker than a distance between a bottom portion of the interconnect trench and an upper surface of the lower interconnect (x of FIG. 10).

Figure 9C:
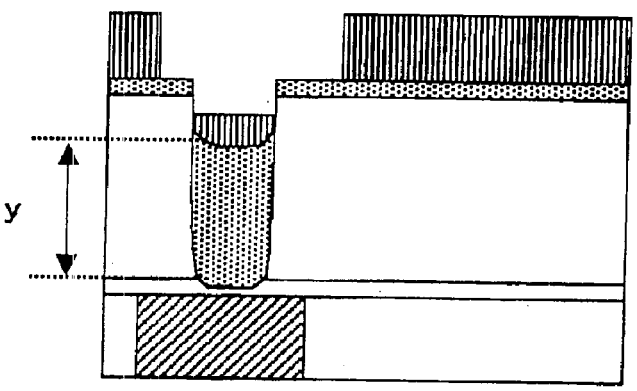
Figure 9C:
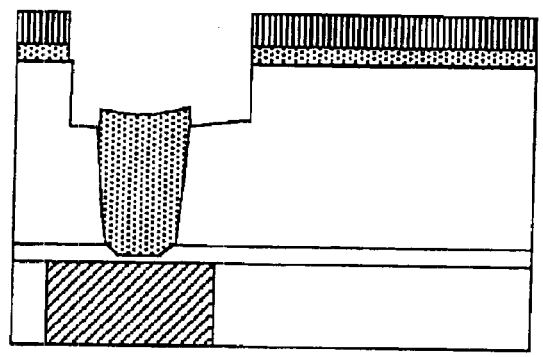
Figure 10:
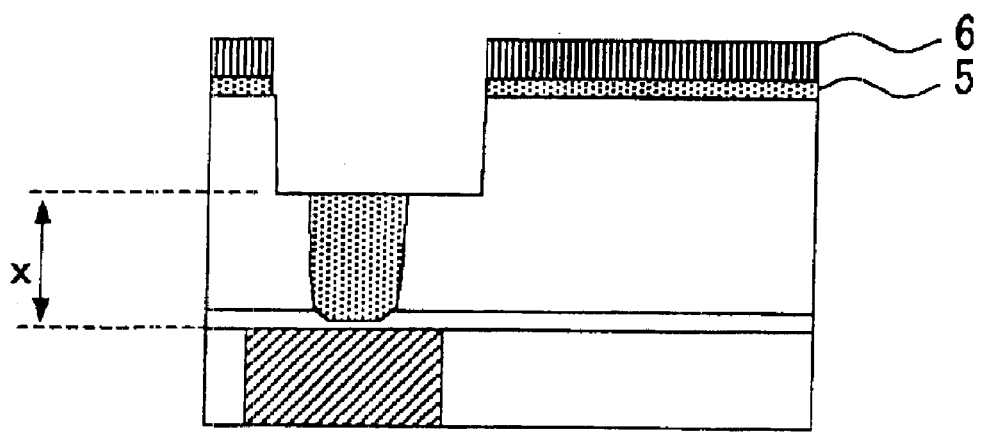
FIG. 10 is a schematic cross-sectional view showing a method of manufacturing a semiconductor device according to the invention.

After the above process, an opening is provided in the resist layer 6, for forming an interconnect trench by etching (FIG. 9B). Then etching is performed on the anti-reflection coating 5 utilizing the resist layer 6 as a mask, after which etching is again performed on the interlayer dielectric film 11, also with the resist layer 6 utilized as a mask. Since the anti-reflection coating 5 is sufficiently thick, the resist layer 6 disappears and the anti-reflection coating 5 alone is exposed inside the interconnect trench during the latter stage of the etching process, as shown in FIG. 9C. With further progress of the etching process from this stage the anti-reflection coating 5 is also removed together with the interlayer dielectric film 11, because of the relatively faster etching rate of the anti-reflection coating 5. As a result, the anti-reflection coating 5 is prevented from remaining as residue that tends to form a projection, and consequently the interconnect having a shape in accordance with a predetermined design as shown in FIG. 10 is attained. Finally, similar to the first and the second embodiments the copper layer is buried in the interconnect trench and the via hole, and then CMP process is performed for completion of the interconnect structure.

According to the method of this embodiment, the formation of a projection can be restrained in the case where the etching rate of the anti-reflection coating is faster than the etching rate of the resist layer.

As described above, the invention has been described referring to the foregoing embodiments. It is to be understood that these embodiments are only exemplifying and that it is apparent to those skilled in the art that various modifications can be made to the respective constituents or processing steps or combinations thereof, without departing from the spirit and scope of the invention.

Figure 11A:
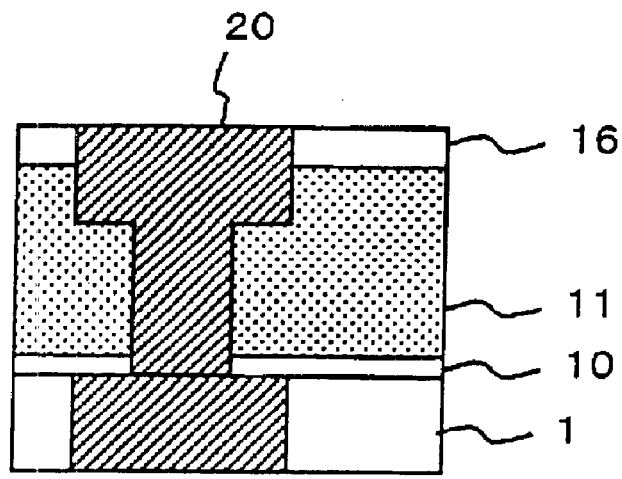
FIGS. 11A and 11B are schematic cross-sectional views showing an interconnect structure achieved by the in accordance with the method of manufacturing a semiconductor device according to the invention.
Figure 11B:
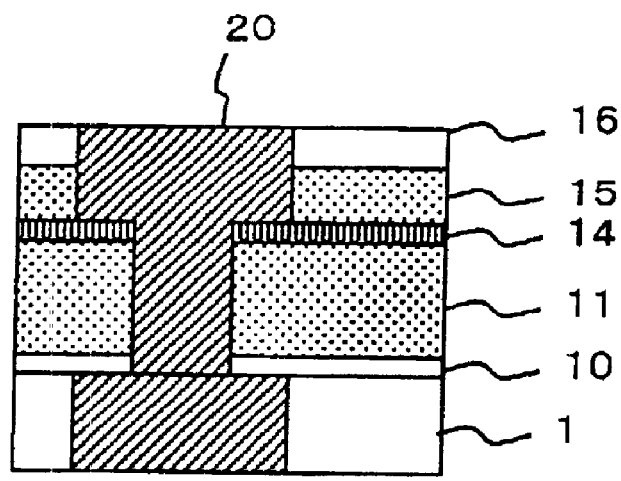

For example, in the above embodiments the interlayer dielectric film is constituted of a single-layer structure of a SiOC film formed through CVD process, while the interlayer dielectric of a multi-layer structure can also be employed instead. For instance as shown in FIG. 11A, a protection layer 16 may be provided on the interlayer dielectric film constituted of SiOC formed through CVD process. As a result, a corner portion of the interconnect trench can be prevented from being deformed by etching through the etching process of the copper diffusion barrier 10 shown in FIG. 8B. Also, the interlayer dielectric film 11 can be prevented from being damaged during the CMP process. Examples of a material for such protection layer include SiN, SiON, SiC, SiCN, SiO₂, etc. Further, as shown in FIG. 11B, an etching barrier 14 may be provided at a lower surface of the upper interconnect 20 in addition to the protection layer 16. Such constitution enables controlling the interconnect trench in accordance with an intended design. Examples of a material for the etching barrier include SiN, SiON, SiC, SiCN, SiO₂, etc. In the interconnect structure shown in FIG. 11B, an interconnect dielectric film 14 constituted essentially of SiOC formed through CVD process is provided between the etching barrier 14 and the protection layer 16.

As described above, according to the invention, the formation of a cylindrical projection during the etching process for forming the interconnect trench by damascene process can be restrained. Therefore, the trench is adequately filled with a material constituting the interconnect.

What is claimed is:

1. A method of manufacturing a semiconductor device, comprising:
    forming a lower interconnect on a semiconductor substrate;
    forming an dielectric film on said lower interconnect;
    performing selective etching on said dielectric film to form a via hole that reaches the proximity of said lower interconnect;
    forming an anti-reflection coating at a bottom portion of said via hole;
    forming a resist layer over the substrate so as to substantially fill a space remaining on said anti-reflection coating in said via hole;
    forming an opening in said resist layer;
    performing selective etching on said dielectric film utilizing said resist layer as a mask to form an interconnect trench for connection with said via hole;
    removing said resist layer and said anti-reflection coating in said via hole to have an upper surface of said lower interconnect exposed; and
    substantially filling said via hole and said interconnect trench with a metal layer;
    wherein said anti-reflection coating is formed to have its thickness at a central portion of said via hole thinner than a distance between the upper surface of said lower interconnect and a bottom portion of said interconnect trench in said forming said anti-reflection coating.

2. The method as set forth in claim 1, further comprising removing said anti-reflection coating remaining at a sidewall of said via hole, between said forming an opening in said resist layer and said forming said interconnect trench.

3. The method as set forth in claim 1, wherein a material and a forming condition of said anti-reflection coating and said resist layer are selected in such a manner that an etching rate of said anti-reflection coating becomes slower than an etching rate of said resist layer in said performing etching on said dielectric film to form said interconnect trench.

4. The method as set forth in claim 2, wherein a material and a forming condition of said anti-reflection coating and said resist layer are selected in such a manner that an etching rate of said anti-reflection coating becomes slower than an etching rate of said resist layer in said performing etching on said dielectric film to form said interconnect trench.

5. A method of manufacturing a semiconductor device, comprising:
    forming a lower interconnect on a semiconductor substrate;
    forming an dielectric film on said lower interconnect;
    performing selective etching on said dielectric film to form a via hole that reaches the proximity of said lower interconnect;
    forming an anti-reflection coating at a bottom portion of said via hole;
    forming a resist layer over the substrate so as to substantially fill a space remaining on said anti-reflection coating in said via hole;
    forming an opening in said resist layer;
    performing selective etching on said dielectric film utilizing said resist layer as a mask to form an interconnect trench for connection with said via hole;
    removing said resist layer and said anti-reflection coating in said via hole to have an upper surface of said lower interconnect exposed; and
    substantially filling said via hole and said interconnect trench with a metal layer;
    wherein said interconnect trench is formed with said anti-reflection coating formed in said via hole being covered with said resist layer in said forming said interconnect trench.

6. The method as set forth in claim 5, wherein a material and a forming condition of said anti-reflection coating and said resist layer are selected in such a manner that an etching rate of said anti-reflection coating becomes slower than an etching rate of said resist layer in said performing etching on said dielectric film to form said interconnect trench.

7. The method as set forth in claim 5, further comprising removing said anti-reflection coating remaining at a sidewall of said via hole, between said forming an opening in said resist layer and said forming said interconnect trench.

8. The method as set forth in claim 7, wherein a material and a forming condition of said anti-reflection coating and said resist layer are selected in such a manner that an etching rate of said anti-reflection coating becomes slower than an etching rate of said resist layer in said performing etching on said dielectric film to form said interconnect trench.

9. A method of manufacturing a semiconductor device, comprising:
    forming a lower interconnect on a semiconductor substrate;
    forming an dielectric film on said lower interconnect;
    performing selective etching on said dielectric film to form a via hole that reaches the proximity of said lower interconnect;
    forming an anti-reflection coating at a bottom portion of said via hole;
    forming a resist layer over the substrate so as to substantially fill a space remaining in said via hole;
    forming an opening in said resist layer;
    performing selective etching on said dielectric film utilizing said resist layer as a mask to form an interconnect trench for connection with said via hole;
    removing said resist layer and said anti-reflection coating in said via hole; and
    substantially filling said via hole and said interconnect trench with a metal layer;
    wherein a material and a forming condition of said anti-reflection coating and said resist layer are selected in such a manner that an etching rate of said anti-reflection coating becomes faster than an etching rate of said resist layer in said performing etching on said dielectric film to form said interconnect trench, and
    said anti-reflection coating is formed to have its thickness at a central portion of said via hole greater than a distance between the upper surface of said lower interconnect and a bottom portion of said interconnect trench in said forming said anti-reflection coating.

* * * * *